United States Patent [19]
Waller

[11] Patent Number: 5,212,440
[45] Date of Patent: May 18, 1993

[54] QUICK RESPONSE CMOS VOLTAGE REFERENCE CIRCUIT

[75] Inventor: William K. Waller, Boise, Id.

[73] Assignee: Micron Technology, Inc., Boise, Id.

[21] Appl. No.: 523,778

[22] Filed: May 14, 1990

[51] Int. Cl.⁵ .............................................. G05F 3/30
[52] U.S. Cl. ........................... 323/313; 323/312; 323/314; 307/296.5; 307/296.8
[58] Field of Search ................... 323/312, 313, 314; 307/296.5, 296.8, 496, 497, 309

[56] References Cited

U.S. PATENT DOCUMENTS

| | | | |
|---|---|---|---|
| 4,307,333 | 12/1981 | Hargrove | 323/313 |
| 4,663,584 | 5/1987 | Okada et al. | 307/296.8 |
| 4,812,735 | 3/1989 | Sawada et al. | 307/296.8 |
| 4,818,901 | 4/1989 | Young et al. | 323/315 |
| 4,906,914 | 3/1990 | Ohsawa | 323/314 |

FOREIGN PATENT DOCUMENTS

| | | |
|---|---|---|
| 0276572 | 8/1988 | European Pat. Off. . |
| 2745302 | 3/1979 | Fed. Rep. of Germany ... 307/296.8 |
| 0039380 | 3/1977 | Japan ................... 307/296.5 |

Primary Examiner—Emanuel T. Voeltz
Attorney, Agent, or Firm—Susan B. Collier

[57] ABSTRACT

A CMOS reference voltage generation circuit having a reference stage and a drive stage. Feedback is provided from the generated reference voltage to the reference stage. The inventive circuit is characterized by low standby current requirements, quick correction to deviations in the output voltage due to load variations, and quick response in generation of a new reference voltage when supply voltage transitions.

18 Claims, 3 Drawing Sheets

QUICK RESPONSE CMOS VOLTAGE REFERENCE CIRCUIT

FIELD OF THE INVENTION

This invention relates to a CMOS intermediate potential generation circuit, which is formed in a semiconductor integrated circuit device and generates an intermediate potential from a power source voltage applied to the device.

BACKGROUND

In an integrated circuit (IC) device, it is often useful to have a potential that is at some intermediate value between the supply potentials to the IC. Many different kinds of circuits have been developed to generate intermediate potentials.

Figure 1:
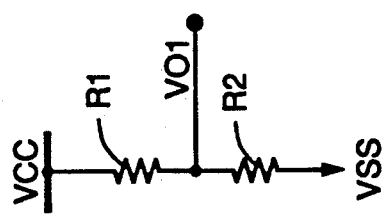
FIG. 1 shows a simple prior art resistive voltage divider, which consumes a significant amount of supply current.

FIG. 1 shows perhaps the simplest of all time. Two resistors R1 and R2 are connected in series from a potential supply VCC to a lower supply potential VSS. The voltage available between the two resistors is the intermediate potential. This circuit is known as a voltage divider. Resistive voltage dividers have a disadvantage of consuming excessive amounts of supply current.

Figure 2:
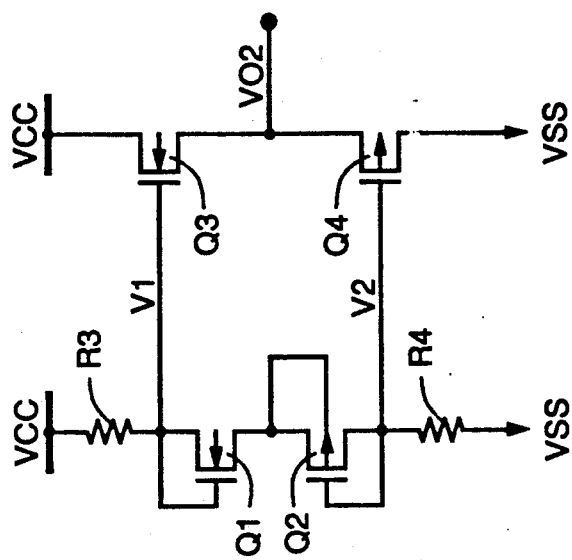
FIG. 2 shows a prior art intermediate potential generation circuit, which offers the improvement of less supply current consumption over the device of FIG. 1.

FIG. 2 shows another kind of intermediate potential generation circuit, developed by Okada et al., U.S. Pat. No. 4,663,584, herein incorporated by reference. A notable feature of this circuit is that transistors Q3 and Q4 drive intermediate potential VO2 only when VO2 strays from a predetermined value. The chain from VCC to VSS formed by R3, Q1, Q2 and R4 require minimal standby current. In this manner, an intermediate potential with a much higher drive can be obtained, while consuming only enough supply current to generate a reference, and to adjust VO2 when it strays from the desired potential.

Figure 3:
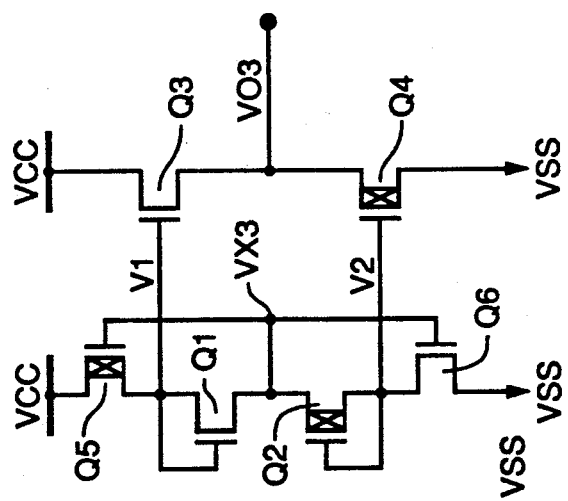
FIG. 3 shows yet another prior art intermediate potential generation circuit, which has the advantage of more quickly responding to changes in VCC than the device of FIG. 2.

FIG. 3 shows a similar circuit, determined by reverse engineering a device made by Hitachi, Ltd., of Tokyo, Japan, which has the advantage of Okada's minimal standby current requirements, but with the advantage of quicker response time in VO3 to transitions in VCC. Hitachi accomplished this speed improvement by replacing resistors R3 and R4 of FIG. 2 with transistors Q5 and Q6 gated by node VX3 as shown in FIG. 3. For example, if VCC undergoes a positive transition, the difference between VX3 and the rising VCC causes Q5 to turn on harder than normal. Node V1 is pulled up which turns on transistor Q3, which pulls up node VO3. When VX3 stabilizes to the new VCC, Q3 is turned back off again and VO3 stabilizes to the new VCC. Similarly, node VO3 is pulled down by Q4 when VCC undergoes a negative transition.

An intermediate potential generation circuit is desired with faster response times than the circuits of FIGS. 2 and 3, both in output corrections due to variations in load, and in generation of new reference levels in response to transitions in supply voltage, but without increased standby current requirements.

Transistor operation is dependent on manufacturing techniques which determine the conductivity type of the transistor. A p-channel transistor is a p-conductive type and an n-channel transistor is an n-conductivity type. P-type conductivity is commonly thought of as a movement of positive charge or holes. N-type conductivity is often thought of as a movement of negative charge or electrons.

SUMMARY OF THE INVENTION

Figure 4:
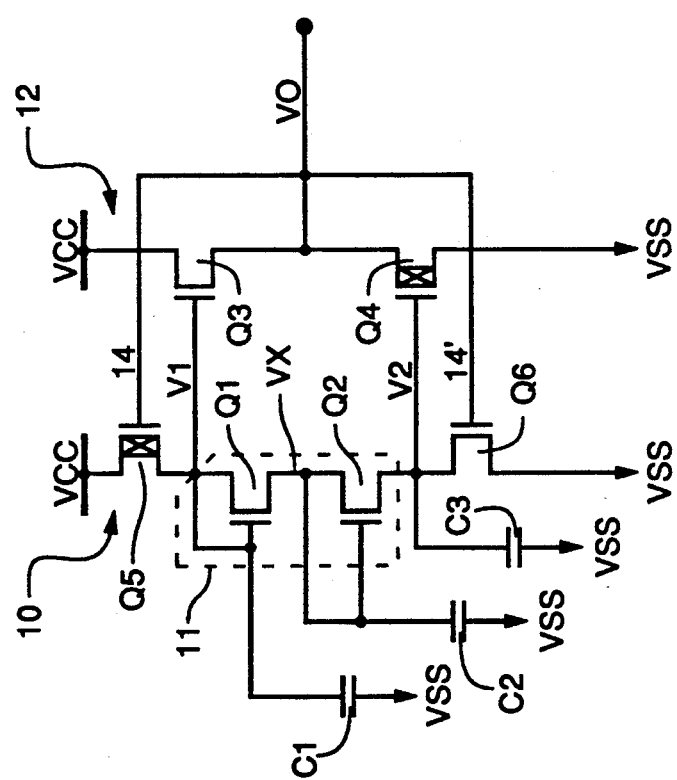
FIG. 4 depicts an embodiment of the invention: an intermediate potential generation circuit which much more quickly responds to changes in VCC than the devices of FIGS. 1-3, while consuming about the same amount of standby current or less than any of the devices of FIGS. 1, 2, and 3. Feedback is provided from output node VO.

FIG. 4 shows a preferred embodiment of the invention. Feedback 14 and 14' from output node VO to transistors Q5 and Q6 provides quick VO correction response to VO transitions due to loading variations, and quick VO response to VCC transitions. Standby current advantages of Okada and Hitachi are preserved.

DETAILED DESCRIPTION OF THE PREFERRED EMBODIMENT

As shown in FIG. 4, a preferred embodiment of the invention includes a reference stage 10 and a drive stage 12.

In reference stage 10, transistors Q5, Q1, Q2 and Q6 are chained between voltage supplies VCC and VSS. It is likely that VSS is at zero potential. Q5 is a p-channel transistors and Q1, Q2, and Q6 are n-channel transistors. Q1 and Q2 are configured as forward-biased diodes by connecting gates and drains, together forming biasing means 11, wherein the threshold voltage characteristics of Q1 and Q2 are exploited to prevent Q3 and Q4 in the drive stage from being on at the same time, thus reducing standby current. Capacitors C1 and C2 couple the gates of Q1 and Q2, respectively, to VSS, or alternatively to VCC. C1-C3 are coupled as shown to avoid circuit oscillation in the event no load is provided on VO. In all practicality, since the intent of VO is to be loaded, C1-C3 are omittable.

Drive stage 12 consists of transistor chain Q3 and Q4 between VCC and VSS. Q3 is an n-channel transistor and Q4 is a p-channel transistor. Q3 and Q4 are driven by nodes V1 and V2, respectively, connected to reference stage 10 as shown in FIG. 4. Feedback 14 and 14' is provided directly from output node VO to the gates of Q5 and Q6 in reference stage 10.

For a basic understanding of the operation of this circuit, assume for sake of illustration that the threshold voltages for both n-channel and p-channel devices are approximately equal at about 1 v. Further assume that all transistors are matched. Further assume that VSS is 0 v.

A "correction" is when variations in a load driven by VO forces VO to deviate from its reference level, and the inventive circuit compensates by urging VO back to its correct level.

A "response" is when VCC or VSS undergo a transition to a new level, and the inventive circuit generates a corresponding new reference level on VO.

CORRECTIONS TO VO TRANSITIONS

In steady state, that is, with no recent transitions on VCC, VX stabilizes at a potential close to midway between VCC and VSS, because Q5 matches Q6 and Q1 matches Q2. V1 is VX+1 v and V2 is VX−1 v. VO stabilizes at a potential close to midway between VCC and VSS. Q5 and Q6 operate in the linear region. For 4 v VCC, node V1 assumes a potential of 3 v, and V2, 1 v. Under these conditions, transistors Q3 and Q4 are barely off and output node VO is urged to an intermediate potential of about 2 v.

If node VO is forced by its load higher than 2 v, say to 2.5 v, the difference between VO and V2 becomes 1.5 v, which is higher than the threshold voltage of Q4. Q4 therefore turns on, pulling VO toward VSS, until VO reaches 2 v and Q4 turns off. Q3 remains off.

The correction is made quicker by feedback 14 and 14' turning down Q5 and turning up Q6, allowing Q6 to pull biasing means 11 (hence V1 and V2) down, further assisting Q4 turn-on and Q3 turn-off.

Similarly, if node VO is forced lower than 2 v, say to 1.5 v, the difference between VO and V1 becomes 1.5 v, which is higher than the threshold voltage of Q3. Q3 turns on, pulling VO toward VCC, until VO reaches 2 v and Q3 turns off. Q4 remains off.

The correction is made quicker by feedback 14 and 14' turning up Q5 and turning down Q6, allowing Q5 to pull biasing means 11 (hence V1 and V2) up, further assisting Q3 turn-on and Q4 turn-off.

RESPONSES TO VCC TRANSITIONS

Figure 5:
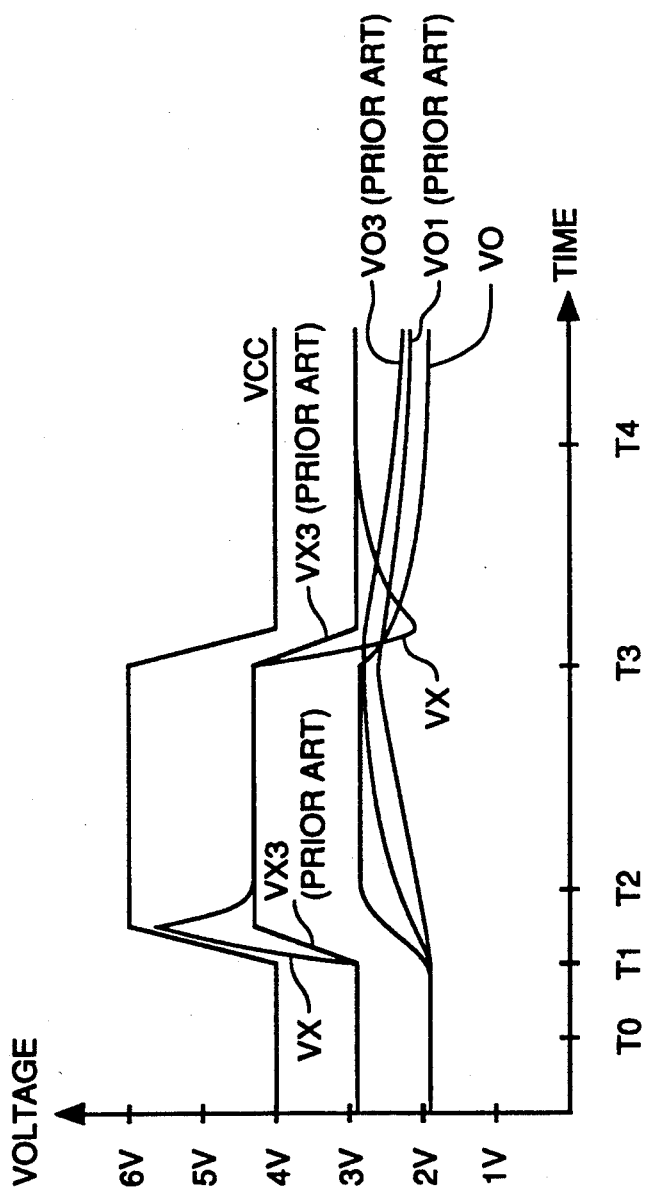
FIG. 5 illustrates the differences in response between the devices of FIGS. 1, 3, and 4, based upon computer simulations. Note that the preferred embodiment is significantly faster, as indicated by the VO curve.

FIG. 5 illustrates the quick response of VO and VX to VCC transitions, also showing prior art VO1, VO3, and VX3 responses for comparison. At time T0, VCC is steady at 4 v. VO stabilizes at approximately 2 v as described above.

At time T1, VCC undergoes a positive transition, from 4 v to 6 v. The difference between VO and VCC approaches 4 v from 2 v, immediately turning up Q5 via feedback 14, which causes node V1 to rise, and V2 via biasing means 11. Rising node V1 turns on Q3. Rising node V2 turns off Q4. VO is quickly pulled up to approximately 3 v at time T2, and Q3 and Q4 equilibrate barely off again.

Note that V1 and V2 overshoot, represented by VX in FIG. 5, for faster response, whereas VX3 (prior art) does not.

Time T3 shows the circuit's response to a negative transition of VCC, from 6 v to 4 v. The difference between VO and VCC approaches 1 v from 3 v, immediately turning down Q5 via feedback 14, which allows Q6 to pull down V2, and V1 via biasing means 11. Falling node V2 turns on Q4. Falling node V1 turns off Q3. VO is quickly pulled down to approximately 4 v at time T4, and Q3 and Q4 equilibrate barely off again. This response is a little slower than for the positive transition. Had the transition been on VSS, the response would have been equivalent.

Note that V1 and V2 undershoot, represented by VX in FIG. 5, for faster response, whereas VX3 (prior art) does not.

In reality, n-channel and p-channel thresholds were about 0.8 v and 1.0 v, respectively. Q1 was about 20 microns wide, and Q2–Q6 were about 20, 20, 20, 10, and 10 microns wide, respectively. Q5 and Q6 were 40 and 45 microns long, respectively. C1, C2, and C3 were on the order of 100 fF. Full positive response (T1 to T2) was obtained in about 70 μs, and full negative response (T3 to T4) was obtained in about 150 μs, for VCC transitions between 4 v and 6 v. Compare this to about 200 μs and over 200 μs, respectively, for the circuit of FIG. 3. The preferred embodiment has a drive stage 12 standby current on the order of 1 μA when matched to a reference stage 10 which draws on the order of 20 μA.

Preferably, but not necessarily, Q1 is matched to Q3, and Q2 to Q4. The ratio of Q1 and Q2 sizes to Q3 and Q4 sizes determines how much standby current Q3 and Q4 use.

Q2 is shown as an n-channel FET gated by VX. Alternatively, Q2 can be a p-channel FET gated by V2, at the price of increased standby current due to typically greater p-channel threshold voltages than n-channel threshold voltages. N-channel Q1 and Q2, because of lower n-channel threshold voltages, turn Q3 and Q4 on less hard, cutting standby power of the inventive circuit by roughly half. Biasing means other than Q1 and Q2 as described may be utilized without escaping the claims below.

Clearly, other modifications may be made to the inventive circuit without escaping circumscription by the claims below.

I claim:

1. A circuit to generate an intermediate potential, comprising:
    an output node;
    a first MOS transistor of p conductivity, having first and second ends and a gate, said first end connectable to a first potential supply source, said gate coupled to said output node;
    a second MOS transistor of n conductivity, having first and second ends and a gate, said first end and gate coupled to said second end of said first MOS transistor;
    a third MOS transistor of n conductivity, having first and second ends and a gate, said first end and gate coupled to said second end of said second MOS transistor;
    a fourth MOS transistor of n conductivity, having first and second ends and a gate, said first end coupled to said second end of said third MOS transistor, said gate coupled to said output node, said second end of said fourth MOS transistor connectable to a second potential supply source;
    a fifth MOS transistor of n conductivity, having first and second ends and a gate, said first end connectable to said first potential supply source, said gate coupled to said second end of said first MOS transistor, said second end coupled to said output node; and
    a sixth MOS transistor of p conductivity, having first and second ends and a gate, said first end coupled to said output node, said gate coupled to said first end of said fourth MOS transistor, said second end connectable to said second potential supply source;
    wherein the intermediate potential is provided on said output node, and said output node provides feedback to said gates of said first and fourth MOS transistors for quick correction and response; and
    wherein a sum of the threshold voltage of said second MOS transistor and the threshold voltage of said third MOS transistor is smaller than a sum of the threshold voltage of said fifth MOS transistor and the absolute value of the threshold voltage of said sixth MOS transistor.

2. A circuit to generate an intermediate potential, comprising:
   an output node;
   a first MOS transistor of a first conductivity type, having first and second ends and a gate, said first end connectable to a first potential supply source, said gate coupled to said output node;
   a second MOS transistor of a second conductivity type, having first and second ends and a gate, said first end and gate coupled to said second end of said first MOS transistor;
   a third MOS transistor of said second conductivity type, having first and second ends and a gate, said first end and gate coupled to said second end of said second MOS transistor;
   a fourth MOS transistor of said second conductivity type, having first and second ends and a gate, said first end coupled to said second end of said third MOS transistor, said gate coupled to said output node, said second end of said fourth MOS transistor connectable to a second potential supply source;
   a fifth MOS transistor of said second conductivity type, having first and second ends and a gate, said first end connectable to said first potential supply source, said gate coupled to said second end of said first MOS transistor, said second end coupled to said output node; and
   a sixth MOS transistor of said first conductivity type, having first and second ends and a gate, said first end coupled to said first end of said fourth MOS transistor, said second end connectable to said second potential supply source;
   wherein the intermediate potential is provided on said output node, and said output node provides feedback to said gates of said first and fourth MOS transistors for quick correction and response.

3. The circuit according to claim 2, wherein said first conductivity is p and said second conductivity type is n.

4. The circuit according to claim 2, wherein a sum of the absolute value of the threshold voltage of said second MOS transistor and the absolute value of the threshold voltage of said third MOS transistor is smaller than a sum of the absolute value of the threshold voltage of said fifth MOS transistor and the absolute value of the threshold voltage of said sixth MOS transistor.

5. A circuit to generate an intermediate potential, comprising:
   an output node;
   a first MOS transistor of a first conductivity type, having first and second ends and a gate, said first end connectable to a first potential supply source;
   biasing means, having first and second ends, said first end coupled to said second end of said first MOS transistor;
   a second MOS transistor of a second conductivity type, having first and second ends and a gate, said first end coupled to said second end of said biasing means, said second end of said second MOS transistor connectable to a second potential supply source;
   a third MOS transistor of said second conductivity type, having first and second ends and gate, said first end connectable to said first potential supply source, said gate coupled to said second end of said first MOS transistor, said second end coupled to said output node; and
   a fourth MOS transistor of said first conductivity type, having first and second ends and a gate, said first end coupled to said output node, said gate coupled to said first end of said second MOS transistor, said second end connectable to said second potential supply source;
   said output node feedback-coupled to said gates of said first and second MOS transistor;
   wherein the intermediate potential is provided on said output node, and said output node provides feedback to said gates of said first and second MOS transistors for quick correction and response.

6. The circuit according to claim 5, wherein an absolute value of the threshold voltage of said biasing means is smaller than a sum of the absolute value of the threshold voltage of said third MOS transistor and the absolute value of the threshold voltage of said fourth MOS transistor.

7. The circuit according to claim 5, wherein said biasing means further comprises first and second serially coupled biasing devices.

8. The circuit according to claim 7, wherein at least one of said first and second biasing devices comprises a forward biased diode.

9. The circuit according to claim 7, wherein at least one of said first and second biasing devices comprises a MOS transistor of said second conductivity type, gated by its drain.

10. The circuit according to claim 8, wherein said forward biased diode comprises a MOS transistor of said second conductivity type, gated by its drain.

11. The circuit according to claim 9, wherein said first conductivity type is p and said second conductivity type is n.

12. The circuit according to claim 10, wherein said first conductivity type is p and said second conductivity type is n.

13. A circuit for providing a desired voltage at a voltage node, comprising:
   a) a driver portion electrically interposed between a supply node and a reference node, said supply node connectable to a supply potential and said reference node connectable to a reference potential, said desired voltage having an intermediate potential set within the range of said supply potential and said reference potential, said voltage node being an output terminal of said driver portion; and
   b) a reference portion electrically interposed between said supply node and said reference node, said voltage node an input terminal to said reference portion, said desired voltage fed back through said input terminal to said reference portion in order to rapidly maintain a stable potential at said voltage node under different load conditions and to rapidly attain a new intermediate potential due to changes in a potential difference between said supply node and said reference node, wherein said driver portion is electrically interposed between said voltage node and said reference portion,
   wherein said reference portion comprises a first threshold device electrically interposed between said supply node and a resistive element and a second threshold device electrically interposed between said reference node and said resistive element, said desired voltage switching said first and second threshold devices to provide first and second output potentials at first and second output nodes respectively, said first output node electrically interposed between said first threshold device and said resistive element and said second output node electrically interposed between said second threshold device and said resistive element, and wherein said driver portion comprises third and fourth threshold devices connected serially at said voltage node, said first output potential providing a gating signal to said third threshold device and said second output potential providing a gating signal to said fourth threshold device, such that a deviation in a potential at said voltage node from said desired voltage assists one of said third and fourth threshold devices in turning on and a remaining one of said third and fourth threshold devices in turning off, in order to rapidly adjust said intermediate potential at said voltage node to said desired voltage, said third threshold device electrically interposed between said supply node and said voltage node and said fourth threshold device electrically interposed between said reference node and said voltage node.

14. The circuit as specified in claim 13, wherein said resistive element comprises serially connected transistors, each of said transistors connected in a diode configuration.

15. The circuit as specified in claim 14 wherein threshold characteristics of said serially connected transistors are exploited to prevent said third and fourth threshold devices from conducting substantially simultaneously in a drive stage.

16. The circuit as specified in claim 14 comprising damping capacitors for capacitively coupling a terminal of each of said serially connected first and second transistors and a terminal of said second threshold device to said reference node in order to minimize circuit oscillation.

17. The circuit as specified in claim 13, wherein a threshold voltage of said first threshold device and said third threshold device are substantially the same and a threshold voltage of said second threshold device and said fourth threshold device are substantially the same.

18. A method of generating a desired voltage at a voltage node, comprising:

a) gating first and second threshold devices with first and second gating signals respectively, such that said desired voltage is provided at said voltage node which is a serial connection of said first and second threshold device, said desired voltage comprising an intermediate potential within the range of a supply potential and a reference potential, said supply and reference potentials connectable to said first and second threshold devices; and b) gating third and fourth threshold devices with said intermediate potential at said voltage node, said gating providing said first and second gating signals at the outputs of said third and fourth threshold devices respectively, said potential at said voltage node controlling the gating of said first and second threshold devices through a feed back of said intermediate potential, said controlling rapidly adjusting the potential of said voltage node to said desired voltage, said third and fourth threshold transistors connectable to said supply and reference potentials.

* * * * *